United States Patent
Haussmann et al.

(10) Patent No.: US 6,635,410 B2
(45) Date of Patent: Oct. 21, 2003

(54) METALLIZING METHOD FOR DIELECTRICS

(75) Inventors: Joerg Haussmann, Freising (DE); Klaus Lowack, Erlangen (DE); Wolfgang Radlik, Munich (DE); Guenter Schmid, Hemhofen (DE); Recai Sezi, Roettenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/156,484

(22) Filed: May 28, 2002

(65) Prior Publication Data

US 2002/0172892 A1 Nov. 21, 2002

Related U.S. Application Data

(63) Continuation of application No. PCT/DE00/03133, filed on Sep. 7, 2000.

(30) Foreign Application Priority Data

Nov. 26, 1999 (DE) .......................... 199 57 130

(51) Int. Cl.⁷ ................................ G03F 7/00
(52) U.S. Cl. .................... 430/313; 430/330; 427/96
(58) Field of Search ................. 430/311, 313, 430/315, 330; 427/58, 96, 98, 99

(56) References Cited

U.S. PATENT DOCUMENTS 5,158,860 A * 10/1992 Gulla .......................... 430/315
5,462,897 A * 10/1995 Baum .......................... 437/230

FOREIGN PATENT DOCUMENTS

DE    198 51 101 A1    5/1999
GB    1 457 008    12/1976

* cited by examiner

*Primary Examiner*—Kathleen Duda
(74) *Attorney, Agent, or Firm*—Laurence A. Greenberg; Werner H. Stemer; Ralph E. Locher

(57) ABSTRACT

A method for metallizing dielectrics includes applying a photosensitive dielectric to a substrate. The dielectric is then exposed to light through a mask, is seeded with a metal and is subjected to a temperature treatment. Afterwards, the dielectric is chemically metallized. Alternatively, the dielectric can be first be seeded with a metal after being applied to the substrate, and can then be exposed to light through a mask. Afterwards, excess seeding material is removed and the dielectric is chemically metallized.

7 Claims, No Drawings

METALLIZING METHOD FOR DIELECTRICS

CROSS-REFERENCE TO RELATED APPLICATION

This application is a continuation of copending International application PCT/DE00/03133, filed Sep. 7, 2000 which designated the United States and which was not published in English.

BACKGROUND OF THE INVENTION

Field of the Invention

In microelectronics, metallic conductors are produced, inter alia, by chemical or electrochemical deposition methods. There is a continuous trend toward more reliable and more economical methods. The metallic conductor tracks of an integrated circuit (IC) or of a multichip module (MCM) consist of, for example, copper. The conductor tracks are insulated using an organic or inorganic dielectric,: such as polyimide or silica. For so-called rewiring of the outer contacts of ICs, simple and selective methods are required for increasing the performance and for reducing the costs. The methods customarily used at present are generally complex and expensive because they consist of numerous individual processes, and also in part, because they include expensive vacuum processes (cf. for example: H. Eigler, W. Beyer "Moderne Produktionsprozesse der Elektrotechnik, Elektronik und Mikrosystemtechnik: Entwurf—Optimierung—Technologietransfer" (Modern production processes of electrical engineering, electronics and Microsystems technology: Design—optimization-technology transfer), expert-Verlaq, 1996, pages 304 to 309).

Thus, for example, applying a thin metal layer, i.e. an electroplating starting layer, to the dielectric using a vacuum process is known. A photoresist is then applied to this metal layer by spin-coating and the photoresist is exposed to light and developed. As a result of the lithographic structuring, specific parts of the surface are bared and the bare metal surface is then metallized by electroplating. After the photoresist has been stripped, a thin electroplating starting layer is etched (cf. for example: W. Menz, P. Bley "'Mikrosystemtechnik für Ingenieure" (Microsystems technology for engineers), VCH Verlagsgesellschaft mbH, 1993, pages 192 to 194, 198 to 199 and 251). However, such a procedure is complicated and expensive.

Published German Patent Application DE 198 51 101 A1 discloses a method for the selective deposition of a metal layer on the surface of a plastics substrate. Those parts of the surface that are to be coated are exposed to electromagnetic radiation, such that chemical bonds are cleaved and functional groups are created as reactive centers. The irradiation is effected in particular using UV radiation at wavelengths of <320 nm, preferably 222 nm. After the irradiation, which is effected using a mask or using a writing laser beam, a noble metal compound is fixed at the reactive functional groups of the surface. For this purpose, the plastics part is either immersed in a swelling solution, for example, in a 5 molar aqueous NaOH solution, or brought into direct contact with a solution containing the substance to be deposited, i.e. with a seed solution. The metal layer is then deposited in a currentless metallization bath.

Such a procedure is not feasible in microelectronics since high-energy radiation, in particular having a wavelength of 222 nm, is required for cleaving the chemical bonds. However, there are no sufficiently powerful lamps of this wavelength. Therefore, the exposure times are substantially longer (factor of >10) than in the case of standard exposures to light. As a result, however, the throughput of seedable substrates is greatly limited and moreover the required excimer UV lamps are very expensive. In addition, low molecular weight fragments that may soil expensive masks are liberated during the cleavage of the bonds. A further disadvantage of the known process is that it is only positive-working, i.e. only the parts exposed to light can be seeded. A procedure in the negative mode, whereby the unexposed parts are seeded, is not possible. This may entail high additional costs for new masks when only negative masks are required, for example, for existing processes.

SUMMARY OF THE INVENTION

It is accordingly an object of the invention to provide a method for metallizing dielectrics which overcomes the above-mentioned disadvantages of the prior art methods of this general type.

In particular, it is an object of the invention to provide a method that is suitable for selectively metallizing dielectrics and that can be used, in particular, in microelectronics. It is necessary to fulfill the requirement for compatibility with the conditions of existing process lines.

With the foregoing and other objects in view there is provided, in accordance with the invention, a method for metallizing dielectrics that includes steps of: applying a photosensitive dielectric including a photosensitive polymer precursor to a substrate; and performing either a first process sequence or a second process sequence. The first process sequence includes exposing the photosensitive polymer precursor to light through a mask, seeding the photosensitive polymer precursor with a metal, and subjecting the photosensitive polymer precursor to a thermal treatment. The second process sequence includes seeding the photosensitive polymer precursor with a metal, exposing the photosensitive polymer precursor to light through a mask, and removing excess seeding material. After performing either the first process sequence or the second process sequence, the photosensitive polymer precursor is chemically metallized.

In accordance with an added feature of the invention, the step of applying the photosensitive dielectric includes: applying the photosensitive polymer precursor, which is in a form selected from the group consisting of a dissolved form and a pasty form, to the substrate, and then drying the photosensitive polymer precursor.

In accordance with an additional feature of the invention, the photosensitive polymer precursor is treated with a metal-containing seed solution or an emulsion.

In accordance with another feature of the invention, the photosensitive polymer precursor is exposed to light through a mask having narrow valley structures and narrow hole structures.

In accordance with a further feature of the invention, the photosensitive polymer precursor has a high chemical and thermal stability.

In accordance with a further feature of the invention, the photosensitive polymer precursor is seeded with a noble metal compound.

In accordance with a further added feature of the invention, the seeding material includes a metal of oxidation state 0.

In accordance with yet an added feature of the invention, the seeding material includes a photosensitive metal complex.

The objects of the invention are achieved by a procedure in which a photosensitive dielectric is applied to a substrate. The dielectric is exposed to light through a mask, the dielectric is seeded with a metal, the dielectric is subjected to a thermal treatment, and the dielectric is then chemically metallized. Alternatively after being applied to the substrate, the dielectric can first be seeded with a metal and can then be exposed to light through a mask. Thereafter, excess seeding material is removed and the dielectric is chemically metallized.

The inventive method thus takes place in a manner such that a photosensitive dielectric is first applied to a substrate. The dielectric is preferably, applied in dissolved or pasty form to the substrate, i.e. in a more or less liquid phase, and is then dried. Thereafter, the dielectric is exposed to light through a mask and is selectively seeded. "Seeding" is understood here as meaning the binding of seeds to the surface and the chemical activation of the seeds. Thereafter, the dielectric is subjected to a thermal treatment, i.e. heated, and chemically metallized. The heating is effected in general at a temperature of 90 to 450° C.

In an alternative procedure, seeding material is first adsorbed onto the total surface of the dielectric. The selective anchoring and activation of the seeds is then affected by exposing them to light through a mask. Thereafter, excess seeding material is removed and the dielectric is chemically metallized. The seeding material is removed, in general, by washing it away with water or with a solvent.

In both cases, the seeding (with a metal) is preferably effected by treating the dielectric with a metal-containing seed solution or emulsion. However, the dielectric can, for example, also be exposed to a seed-containing atmosphere or a readily volatile metal compound.

It has also proven advantageous to use a mask having narrow valley and hole structures when exposing the dielectric to light. In fact, particularly good results are achieved thereby. The holes preferably have a diameter of about 1 to 3 $\mu$m and the distance between the holes is likewise about 1 to 3 $\mu$m.

The dielectric preferably consists of a polymer and a photoactive component. However, a polymer which itself has photosensitivity can advantageously also be used, i.e. in this case the dielectric is a photostructurable polymer. Besides, the polymer may also be a copolymer or a polymer blend.

The polymer advantageously has high chemical and thermal stability. As a result, soldering and cleaning processes and the chemical metallization are withstood without damage. The polymer may be of an organic or inorganic/organic nature. In particular, the use of the following types of polymer has proven advantageous: polyimides, polybenzoxazoles, polybenzimidazoles, predominantly aromatic polyethers, polyether ketones and polyethersulfones, benzocyclobutene, poly-quinolines, polyguinoxalines and polysiloxanes (silicones). Copolymers or blends of these polymers with one another are likewise suitable.

Photostructurable polymers are widely known and are also commercially available. In the inventive method, the following polymers are preferably used as the dielectric positively photostructurable polymers based on polybenzoxazoles (cf. for example: Issued European Patent EP 0 023 662 B1 and European Patent Application EP 0 264 678 81) or on polyimides, and negatively photostructurable polymers based on polyimides (cf. for example: U.S. Pat. No. 3,957,512 and Reissue Pat. No. 30,186).

The inventive method has the following substantial advantages:

The exposure to light can be effected in the near or deep UV range, i.e. between 200 and 450 nm, depending on the composition of the dielectric; the range between 350 and 450 nm is particularly suitable. It is therefore possible to use economical exposure units which are already employed in the process line.

The exposure times are short so that a good throughput is ensured.

Depending on the composition of the dielectric, exposed or unexposed parts can be selectively seeded.

During the exposure to light, the dielectric, i.e. the polymer is not degraded or cleaved at the surface so that no harmful low molecular weight products can be formed.

The substrate consists in general of silicon or ceramic material, it being possible for it already to have—below the dielectric layer—electronic circuits, including metal layers and insulating layers. However, the substrate may also consist of glass or metal.

The dielectric can be applied in dissolved form or as a paste to the substrate. Suitable techniques are, for example, spin-coating, casting, dispensing, knife-coating, tampon printing, inkjet printing and screen printing. Fillers may also be added to the dielectric particularly when used as a paste and for screen printing.

The seeding can be effected by using metal-containing seed solutions or emulsions, for example, by immersing the dielectric. For this purpose, the seed solutions or emulsions contain one or more metal compounds in ionic or colloidal form. The seeds are materials that catalyze the deposition of a metal from a solution metastable to redox chemical reactions. Suitable seeds are in particular, noble metals, such as ruthenium (Ru), rhodium (Rh), palladium (Pd), silver (Ag), osmium (Os), iridium (Ir), platinum (Pt) and gold (Au), or corresponding compounds and complexes (of an organic and/or inorganic nature). Such compounds are, for example, palladium compounds, such as Pd acetate and Pd chloride.

Suitable complex compounds are, in particular, functionalized cis-diamino-di(pseudo)halo or -alkenyl complexes of Pd(II) compounds or of Pt(II) compounds, since they have groups which are capable of undergoing a chemical reaction. The reaction is, for example, all the more selective, the more amino groups the ligand carries which are not coordinated by the central atom, as is the case, for example, with cis-$\eta$2-N,N-bis(2-amino ethyl) aminodicyanoplatinum (11). Complexes in which the metal is already present in oxidation state 0 are particularly suitable because, as a result of this, the formation of seeds or clusters is considerably simplified, and takes place in particular on modified surfaces. Such complexes are, for example, triphosphino complexes of palladium and platinum. The ligand systems of such complexes can be very easily modified, for example, by sulfonation or amination. Examples of modified systems are 3-[bis(3-sulfophenyl)phosphino]-benzosulfonic acid and 1,3,5-triaza-7-phosphotricyclo-(3.3.1.1]decane. As a result of the modification of the ligand systems, the complexes diffuse either into the exposed or into the unexposed parts of the dielectric. There, they can adhere to functional groups of the dielectric—via ionic bonding—or they react directly with the dielectric.

In the inventive method, the metal complexes that are photosensitive are furthermore suitable. These are in, particular, noble metal complexes having alkene ligands or having ligands that undergo reactions on exposure to light, as is the case with $\eta$2-bipyridyl-4,4'-diamino-$\eta$2-stilbenopalladium (II). On exposure to light, such complexes react selectively with the exposed or with the unexposed parts of the dielectric. In addition, the metal complexes can generally have a mononuclear or polynuclear structure. Polynuclear complexes, so-called clusters, are so to speak preformed metal seeds.

Suitable solvents for the seed solution are water or organic solvents and a corresponding mixture. The following organic solvents are particularly suitable: ethanol, isoproponol, acetone, butanone, cyclo-pentanone, cyclohexanone, tetrahydrofuran, butyrolactone, N-methylpyrrolidone, ethyl acetate, butyl acetate, ethoxyethyl acetate and ethoxyethyl propionate. The seed solution may also contain surfactants, in ionic or nonionic form, and amines, such as triethylamine and tetramethylammonium hydroxide.

Other features which are considered as characteristic for the invention are set forth in the appended claims.

Although the invention is illustrated and described herein as embodied in metallizing method for dielectrics, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the examples described below.

DESCRIPTION OF THE PREFERRED EMBODIMENTS

Photosensitive precursors of polymers that are stable at high temperatures, in particular, those of polyimides and polybenzoxazoles, are preferably used for producing the metallized dielectrics. These precursors or corresponding solutions are commercially available. Photosensitive polyimide precursors are, for example, negative working polyamide acid esters, and photosensitive polybenzoxazole precursors are, for example, positive-working polyhydroxyamides to which a diazonaphthoquinone has been added. These polymer precursors, which are, for example, soluble in N-methylpyrrolidone, form homogeneous layers on a substrate during spin-coating and are sensitive to exposure to i-line and g-line light. A beating process results in the formation of the corresponding polymers, i.e. polyimides and polybenzoxazoles, which are thermally stable up to 400° C. and 450° C., respectively. The dielectrics obtained are resistant to acidic and neutral etching solutions.

EXAMPLE 1

A commercial solution of a photosensitive precursor of a polyimide (PI) is applied to a silicon substrate using a horizontal spin coater at 3000 rpm (spin-coating time: 20 s). Drying is then effected for 4 min at 100° C. on a hotplate. The obtained film is exposed through a mask using a contact exposure unit (exposure dose: 250 mJ/cm$^2$); the PI precursor crosslinks thereby. The substrate is then immersed for 10 min in a palladium complex solution consisting of 200 mg of bis(acetato)bis(triphenylphosphino)palladium dissolved in 950 ml of isopropanol and 50 ml of demineralized water and is then washed with isopropanol and demineralized water. The palladium complex only adheres to the uncrosslinked parts of the polyimide, i.e. in the unexposed parts. The substrate is heated for 30 min at 300° C. on a hotplate under nitrogen, and the palladium complex is then reduced (RT 2 min) with an alkaline borohydride solution (1 g of sodium borohydride and 5 g of sodium hydroxide, dissolved in 1000 ml of water). Chemical copper-plating is then effected—selectively in the seeded parts by immersion for 15 minutes in a commercial chemical copper bath. A homogeneous strongly adhering copper layer is thereby obtained. The copper bath is, for example, a metastable solution having the following components: copper salt, complexing agent, such as tetrakis(2-hydroxyethyl) ethylenediamine or ethylenediaminetetraacetic acid (EDTA), reducing agent, such as formaldehyde, and stabilizers.

EXAMPLE 2

The procedure corresponds to example 1, but the metallization is effected using a commercial chemical nickel bath. The nickel bath is, for example, a metastable solution including the following components: nickel salt, a complexing agent, such as citrate or tartrate, and a reducing agent, such as sodium hypophosphite. Here too, a homogeneous strongly adhering metal layer is obtained.

EXAMPLE 3

A commercial solution of a photosensitive precursor of a polybenzoxazole (PBO) is applied to a glass substrate using a horizontal spin coater at 3500 rpm (spin-coating time: 20 s). Drying is then effected: 60 s at 90° C. and then 120 s at 120° C. The film obtained is exposed through a mask using a contact exposure unit (exposure dose: 300 mJ/cm$^2$). As a result of the exposure, carboxyl groups are generated in the film. The substrate is then immersed for 10 min in a palladium complex solution consisting of 200 mg of η2-bipyridyl-4,4'-diamino-η2-stilbenoplatinum (II) dissolved in 1000 ml of an isopropanol/water mixture (volume ratio 3:1). The palladium complex thereby adheres to the carboxyl groups. Thus, only the exposed parts of the film are seeded. The substrate is heated for 3 min at 250° C. and for 3 min at 350° C. on a hotplate under nitrogen, and the palladium complex is then reduced with a hydrazine solution (5% strength solution in water) (RT 5 min). The exposed parts are then metallized in a corresponding manner as in example 1. A homogeneous strongly adhering copper layer is obtained thereby.

The following solution can also be used as a seeding solution under otherwise identical conditions: 250 mg of the platinum complex cis [Pt$_4$(hp)$_4$(NH$_3$)$_8$(NO$_3$)$_2$](NO$_3$)–3H$_2$O dissolved in 500 ml of water to which 0.5 ml of 24% strength ammonia solution was added; "hp" represents a deprotonated 2-hydroxypyridine. The same results are obtained.

EXAMPLE 4

A solution of photosensitive PBO precursor is applied to a substrate by spin-coating, and is dried and exposed through a mask, according to example 3. The substrate is then immersed at 40° C. for 1 min in a swelling solution consisting of diethylene glycol monoethyl ether and demineralized water (volume ratio 1:1). Only the exposed parts are swollen here. If the substrate is then immersed at room temperature for 10 min in an aqueous palladium chloride solution (300 mg/l), the palladium ions become embedded in the exposed PBO parts. After reduction of the palladium salt (4 min) by immersion in a neutral sodium borohydride solution (2 g, dissolved in 1000 ml of water), the PBO is heated at 285° C. for 20 min on a hotplate under nitrogen and is then metallized analogously to example 2. A homogeneous strongly adhering metal layer is obtained.

EXAMPLE 5

A solution of a photosensitive polyimide precursor is applied to a substrate by spin-coating and is dried, according to example 1. The substrate is then immersed for 10 min in a tetrakis (triphenylphosphino)-palladium (O) solution consisting of 150 mg of palladium complex dissolved in 1000 ml of toluene, is washed for 1 min with toluene/methanol (1:1) and is dried for 2 min at 100° C. Exposure to light for structuring is then effected using a contact exposure unit (exposure dose: 250 mJ/cm$^2$). The substrate is then washed with toluene for 2 min, with toluene/methanol for 1 min and with methanol for 1 min, is heated at 300° C. and is then metallized according to example 1. A homogeneous strongly adhering copper layer is obtained in the exposed parts.

EXAMPLE 6

A solution of a photosensitive polyimide precursor is applied by spin-coating to a silicon substrate (4 inches) and is dried according to example 1. Then 10 ml of an ethanolic di-$\mu$-chlorotetraethylenedirhodium(I) solution (50 mg/l) is sprayed onto the substrate, and the substrate is subsequently dried for 3 min at 65° C. The substrate is then exposed to light through a mask using a contact exposure unit (exposure dose: 200 mJ/cm$^2$). The polyimide crosslinks in the exposed parts, and in addition, the rhodium complex decomposes. The polyimide is then developed for 60 s with a commercial polyimide developer (main components: butyl acetate and $\gamma$-butyrolactone), is washed in each case for 60 s with butyl acetate, isopropanol, isopropanol/demineralized water (1:1) and demineralized water and is dried for 4 min at 100° C. The rhodium complex is then reduced by immersion (10 min) in an ascorbic acid solution in water/ethanol (1:1), is adjusted to pH 8, and the polyimide is heated at 325° C. for 40 min under nitrogen and is then metallized according to example 2. A homogeneous strongly adhering metal layer is obtained.

EXAMPLE 7

A solution of a photosensitive polyimide precursor is applied by spin-coating to a substrate and is dried according to example 1. A platinum complex solution consisting of 200 mg of $\eta$2-bipyridyl-4, 4'-diamino-$\eta$2-stilbenoplatinum(II) and 6 g of polypropylene glycol dissolved in a mixture of 200 ml of $\gamma$-butyrolactone, 200 ml of isopropanol and 5 ml of water is then applied to the substrate by spin-coating at 2500 rpm (25 s). The film that is obtained is dried at 110° C. for 4 min. After being exposed for structuring using a contact exposure unit (exposure dose: 350 mJ/cm$^2$), during which the platinum complex is activated and the polyimide is crosslinked, the polyimide is developed according to example 6 and is then heated at 350° C. for 1 h. The exposed parts are then metallized according to example 1. A homogeneous strongly adhering copper layer is obtained.

We claim:

1. A method for metallizing dielectrics, which comprises:
   applying a photosensitive dielectric to a substrate, said photosensitive dielectric being a photostructurable polymer;
   performing a process sequence selected from the group consisting of a first process sequence and a second process sequence,
      the first process sequence including exposing the photostructurable polymer to light through a mask, seeding the photostructurable polymer with a metal, and subjecting the photostructurable polymer to a thermal treatment, and
      the second process sequence including seeding the photostructurable polymer with a metal, exposing the photostructurable polymer to light through a mask and removing excess seeding material; and
   subsequently chemically metallizing the photostructurable polymer.

2. The method according to claim 1, wherein the step of applying the photosensitive dielectric includes:
   applying the photostructurable polymer, in a form selected from the group consisting of a dissolved form and a pasty form, to the substrate, and then drying the photostructurable polymer.

3. The method according to claim 1, which comprises: treating the photostructurable polymer with a substance selected from the group consisting of a metal-containing seed solution and an emulsion.

4. The method according to claim 1, which comprises: exposing the photostructurable polymer to light through a mask having narrow valley structures and narrow hole structures.

5. The method according to claim 1, which comprises: seeding the photostructurable polymer with a noble metal compound.

6. The method according to claim 1, which comprises: providing seeding material including a metal of oxidation state 0.

7. The method according to claim 1, which comprises: providing seeding material including a photosensitive metal complex.

* * * * *